(12) United States Patent
Ossimitz (10) Patent No.: US 9,204,543 B2
(45) Date of Patent: Dec. 1, 2015

(54) INTEGRATED IC PACKAGE

(71) Applicant: Infineon Technologies AG, Neubiberg (DE)

(72) Inventor: Peter Ossimitz, Munich (DE)

(73) Assignee: Infineon Technologies AG, Neubiberg (DE)

( * ) Notice: Subject to any disclaimer, the term of this patent is extended or adjusted under 35 U.S.C. 154(b) by 76 days.

(21) Appl. No.: 14/094,862

(22) Filed: Dec. 3, 2013

(65) Prior Publication Data

US 2015/0156872 A1    Jun. 4, 2015

(51) Int. Cl.
| | |
|---|---|
| *H01L 23/52* | (2006.01) |
| *H01L 23/48* | (2006.01) |
| *H05K 1/11* | (2006.01) |
| *H05K 1/09* | (2006.01) |
| *H05K 1/18* | (2006.01) |
| *H05K 3/10* | (2006.01) |

(52) U.S. Cl.
CPC .................. *H05K 1/111* (2013.01); *H05K 1/09* (2013.01); *H05K 1/181* (2013.01); *H05K 3/10* (2013.01); *H05K 2201/10234* (2013.01); *H05K 2201/10734* (2013.01)

(58) Field of Classification Search
CPC ......... H05K 1/111; H05K 1/09; H05K 1/181; H05K 3/10; H05K 2201/10234; H05K 2201/10734
USPC ........................................................ 257/778
See application file for complete search history.

(56) References Cited

U.S. PATENT DOCUMENTS

| 6,611,635 | B1 * | 8/2003 | Yoshimura et al. ............. 385/14 |
| 6,737,743 | B2 * | 5/2004 | Urakawa ........................ 257/724 |
| 6,911,730 | B1 * | 6/2005 | New ............................... 257/724 |
| 7,062,744 | B2 * | 6/2006 | Osann, Jr. ...................... 716/106 |
| 7,216,324 | B2 | 5/2007 | Chang |
| 7,673,273 | B2 * | 3/2010 | Madurawe et al. ............. 716/138 |
| 8,248,091 | B2 * | 8/2012 | Cheng et al. ................ 324/754.07 |
| 8,704,384 | B2 * | 4/2014 | Wu et al. ........................ 257/782 |
| 2011/0024173 | A1 | 2/2011 | Wu et al. |
| 2012/0138349 | A1 | 6/2012 | Harvey et al. |

\* cited by examiner

*Primary Examiner* — Luan C Thai
(74) *Attorney, Agent, or Firm* — Schiff Hardin LLP (57) ABSTRACT

An Integrated Circuit (IC) package comprises a package comprising a first set of pads having a pinout that is compatible with a chip core of a product family. A second set of pads are on substantially the same plane as the first set of pads and outside the package core. The second set of pads is configured to accommodate a circuit outside the chip core. The geometric center of the package core is different from the geometric center of the IC package.

21 Claims, 5 Drawing Sheets

INTEGRATED IC PACKAGE

BACKGROUND

In electronics manufacturing, integrated circuit ("IC") packaging is the step of semiconductor device fabrication, in which the IC is encased in a supporting case that prevents physical damage and exposure to the elements. The case (i.e., "package") supports the electrical contacts that connect the device to a circuit board. There are a variety of different types of packages (e.g., through-hole, surface mount, pin grid array, lead-frame based, (e.g. TSSOP, QFP, QFN) chip-scale package (CSP), ball grid array (BGA), Multi Chip Package (MCM), etc.). Some package types have standardized dimensions and tolerances and are registered with trade industry associations such as JEDEC. Other types of packages may be tailored for specific IC chips.

For example, a BGA is a type of surface-mount package used for ICs. A BGA can provide more interconnection pins than other typical packages, such as dual in-line or lead-frame package. BGAs allow the entire bottom surface of the package to be used for interconnects instead of just the perimeter. Accordingly, BGAs provide many interconnections while maintaining a small form factor.

BGA's may be used for a product family (i.e., IC chips) that share a common chip core (e.g., circuit block). The product family may include different generations of IC chips and/or IC chips that have a common core but may include different and/or additional features and functionality. It will be understood that additional features and functions typically use additional pins. Traditionally, to maintain cost and for design compatibility, the pin-out on the package for the product family is maintained for the chip core while the package is increased in size symmetrically from the center to accommodate the additional pins (e.g., solder balls in BGA packages) for the additional circuitry/functionality. Such linear scaling may unnecessarily increase package dimensions, cost, and complexity.

DETAILED DESCRIPTION

The present disclosure generally relates to methods and systems of providing packages for a family of chip products that share a common chip core, referred to herein as the "chip core." The chip core has a package pin-out that is common to every package in the product family, referred to herein as the "package core." The product family may include circuits in addition to the chip core 100 to provide additional functions and/or features. Each package in the family is configured to accommodate the additional functions and/or features by providing additional pins while maintaining the package pin-out for the chip core 100. The additional pins are placed asymmetrically with respect to the center of the package core.

Figure 1:
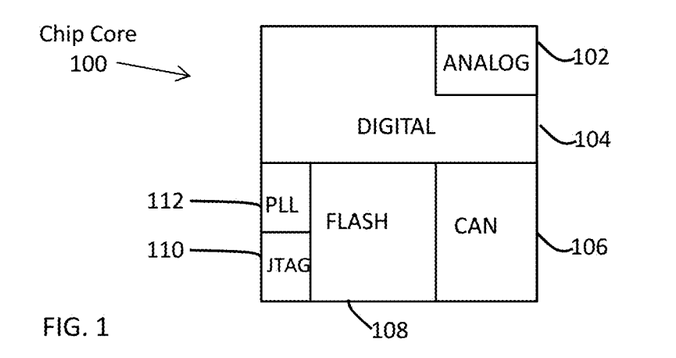
FIG. 1 illustrates an integrated circuit that may be used as a chip core.

FIG. 1 illustrates a typical integrated circuit (IC), sometimes referred to as a semiconductor chip. ICs may include any of analog circuits 102, digital circuits 104, memory, such as FLASH 108, interface circuits and ports, such as those for controller area network (CAN) 106 and Joint Test Action Group (JTAG) 110, and control systems, such as a phase-locked loop (PLL) 112. Accordingly, semiconductor chips may be analog, digital, or mixed signal (i.e., include both analog and digital circuit blocks on the same chip). One or any combination of the blocks, (e.g., circuit blocks 102 to 112 of FIG. 1), may represent a chip core 100. A chip core 100 is one or more circuits or circuit blocks that are common in a family of chip products. Put differently, the product family includes IC chips that share a common chip core 100 but may include additional functions and/or features. In one implementation, the additional functions and/or features are implemented by circuits placed outside the chip core 100.

For example, the digital integrated circuit block 104 may include from one to millions of transistors, logic gates, flip-flops, multiplexers, and other circuits that use binary logic to communicate signals. The analog circuit block 102 may include operational amplifiers, sensors, power management circuits, etc. The analog circuit block 102 may perform functions like amplification, filtering, demodulation, and mixing by processing continuous signals. Analog circuits typically operate in different voltage domains and may use power supplies different from the digital integrated circuit block 104.

Those skilled in the art will appreciate that each circuit block type (e.g., analog, digital, memory, etc.) is preferably placed in its own region. Thus, a chip is partitioned into various analog 102, digital 104, and mixed-signal blocks to overcome signal, power, and reliability constraints. As noted above, the analog circuit block 102 may operate at different power levels than the digital block 104. Further, there may be cross-talk concerns between the blocks that may corrupt the signals carried in each block, respectively. Accordingly, in the product family, circuits beyond the chip core 100 are typically placed in regions close to their block types. For example, additional analog circuits are placed next to analog circuit block 102 while additional flash memory is placed closer to block 108.

One frequent challenge faced by design engineers is how to optimize the wiring on a chip, the package, and the customer board (e.g., a printed circuit board (PCB)). As the features and circuit size increases for the product family (i.e., beyond the chip core 100), additional input/output (I/O) and/or power pins are included to accommodate the additional signaling and power demands.

Figure 2A:
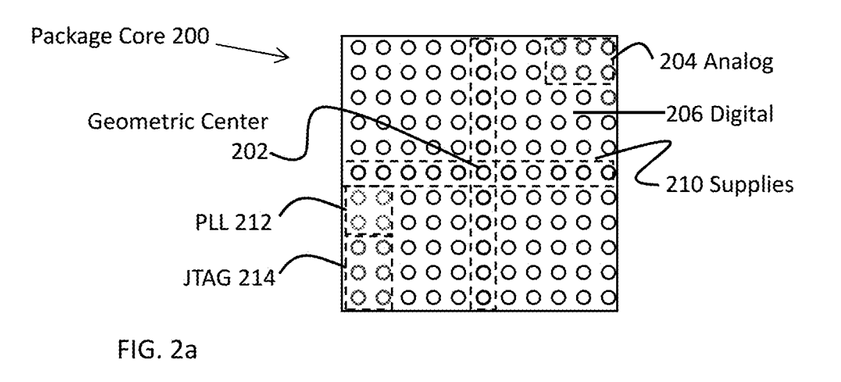
FIG. 2a illustrates the ballout on a chip package configured to accommodate the chip core of FIG. 1.
Figure 2B:
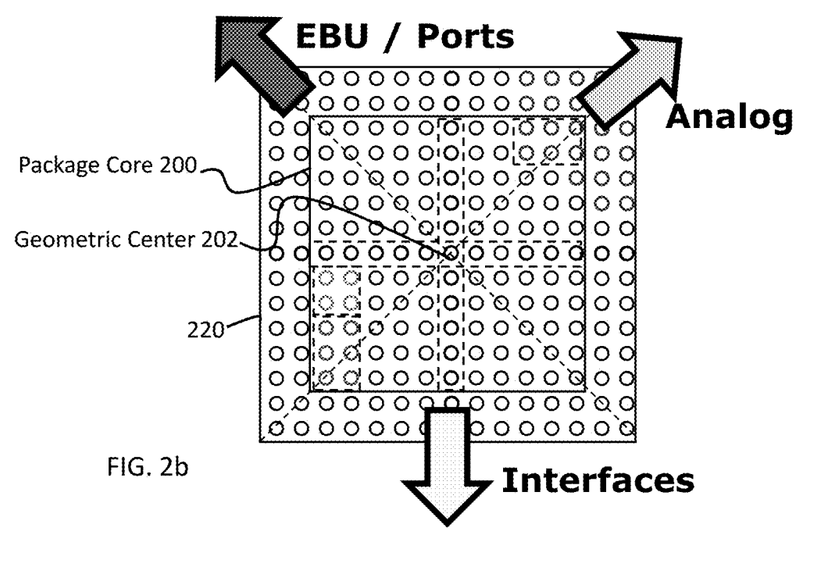
FIG. 2b illustrates the ballout of a typical chip package that accommodates the chip core and functions and/or features in addition to those of the chip core.

FIGS. 2a and 2b together illustrate a typical expansion of a chip package for two different members of a product family. For purposes of a representative example, the drawings show and we will discuss BGA packages. However, BGA packages are provided by way of example; and the subject matter described herein is not intended to be limited thereto. Thus, other known package types can be used as well. Accordingly, the terms "pin," "ball," and "pad" are used interchangeably.

FIG. 2a illustrates the ballout (e.g., location of solder balls) on a chip package. In the example of FIG. 2a, the ballout of the ball grid array (BGA) accommodates the chip core 100. Put differently, it is the package core 200 that is common to all packages in the same product family. In the example of FIG. 2a, the package core 200 has predefined solder ball locations for the analog circuits 204, digital circuits 206, power supplies 210, PLL 212, and JTAG 214, respectively.

FIG. 2b illustrates the ballout on a typical chip package that accommodates additional functions and/or features of the chip. As discussed above, as functions and features increase in a product family, circuits in addition to the chip core 100 are introduced to the IC. Accordingly, additional I/O and/or power pins may be used for different members of the product family. To that end, additional solder balls are introduced in addition to the package core 200 to accommodate the increased complexity of the chip in the product family.

As illustrated in FIG. 2b, the typical approach is to increase the number of pins (e.g., solder balls) in the package symmetrically with respect to the geometric center 202 of the package core 200. To reduce design cost and maintain compatibility in the in product family, the package core 200 is kept the same (i.e., the ballout is maintained in the package core 200) while the package (and number of pads) is increased in size symmetrically in each planar direction (i.e., left, right, top, and bottom). Thus, even if only the analog block is expanded on the chip, additional pins (e.g., solder balls) are introduced not only in the top right area of the package, but also in every direction such that geometric center 202 of the package core is the same as the geometric center of the larger package 220. Such symmetric approach does not optimize package size, unnecessarily increases the size of the customer board (e.g., PCB), and increases material cost.

Figure 3A:
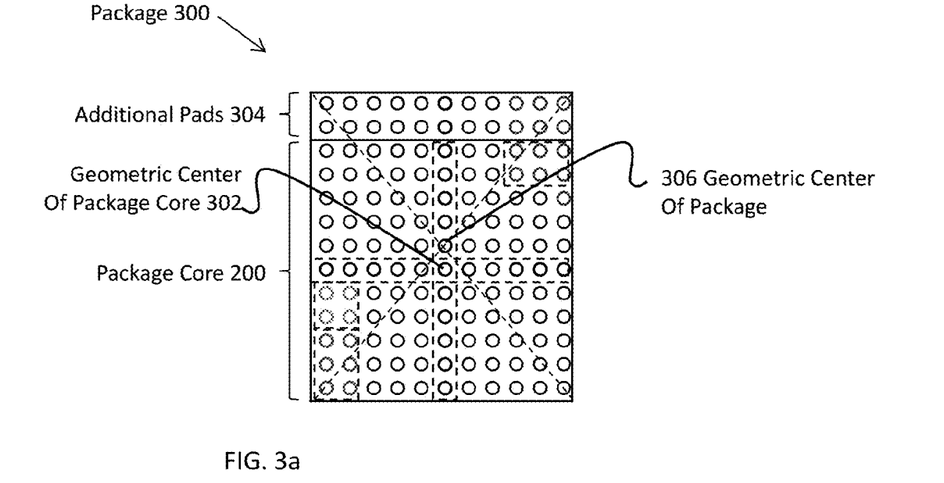
FIG. 3a illustrates an exemplary package having a second set of pads that are added in the first direction of the package.

Reference now is made to FIG. 3a, which illustrates an exemplary package having a core area 200 and additional pads 304. In the example of FIG. 3a, the first set of pads (i.e., corresponding to the package core 200) has a ballout and dimensions that is compatible with a chip core 100 of all members of a product family. The second set of (i.e., additional) pads 304 is located on substantially the same plane as the first set of pads 200 and is configured to accommodate one or more circuits outside the chip core 100 of the product family. In the example of FIG. 3a, the additional pads are added in the first (e.g., top with respect to FIG. 3a) direction of the package 300. For example, the additional pads 304 may be added to accommodate additional circuits that were added in the first direction of the chip (e.g., analog and/or digital circuits) in the product family. By adding pads in the direction of circuit block(s) that were added in addition to the chip core 100, the package 300 size is better optimized. The second set of pads is added only to the direction(s) in which the additional circuits are added outside the core area of the chip. As a result, the second set of pads is located asymmetrically with respect to the first set of pads, while the ballout of the package core 200 is maintained. Put differently, the resulting geometric center of the package 306 is different from the geometric center 302 of the package core 200.

Figure 3B:
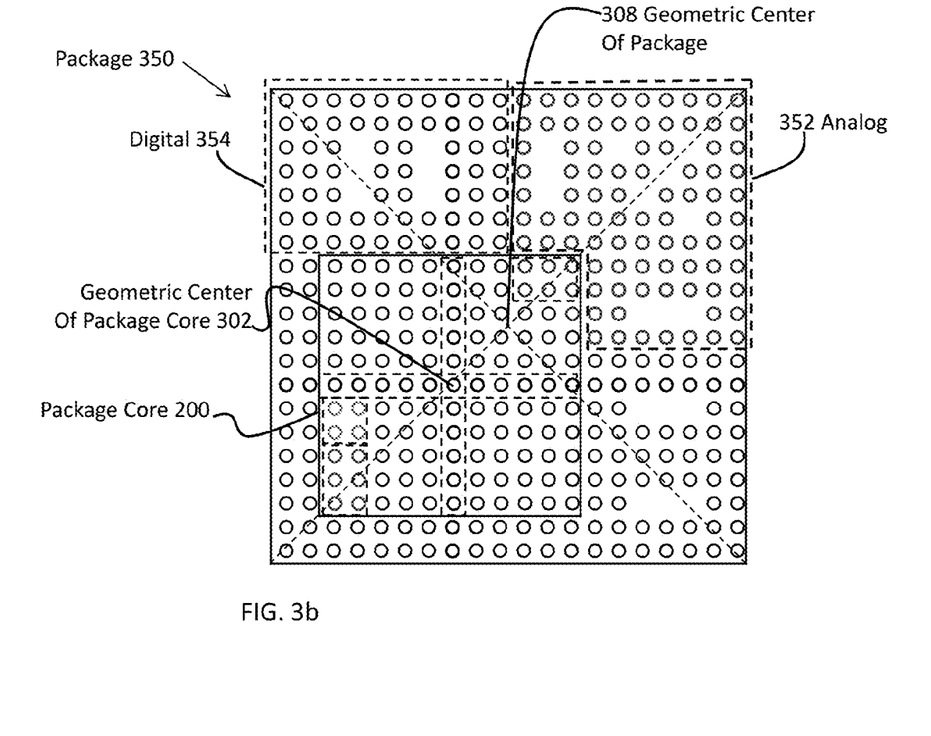
FIG. 3b illustrates an exemplary package having a second set of pads that are added in the multiple directions of the package.

FIG. 3b illustrates an exemplary package having a core area 200 and additional pads (i.e., pads outside the package core 200) added in multiple directions. The first set of pads (i.e., pads of the package core 200) has a ballout and dimensions compatible with the chip core 100 of the same product family. The second set of pads is configured to accommodate one or more circuits outside the chip core 100 of the product family. In the exemplary package 350, the additional pads are added in the first (e.g., top), second, (e.g., bottom), third (e.g., right) and fourth (e.g., left) direction from the package core 200 asymmetrically with respect to the package core 200. Thus, although pads are added in all four directions, a larger concentration of pads is added in two directions (i.e., first and third directions in the example of FIG. 3b). In one embodiment, the second set of pads is added in specific directions in proportion to the additional circuits that were added outside the chip core 100. For example, the second set of pads in package 350 may include additional pads to accommodate analog functionality 352, additional pads to accommodate digital functionality 354, etc. By adding additional pads in the direction of circuit block(s) that were added in addition to the chip core 100, the package size is better optimized for the particular member (i.e., chip) of the product family. As a result, the second set of pads is located asymmetrically with respect to the first set of pads, while the ballout of the package core 200 is maintained. As in package 300, the resulting geometric center of the package 308 is different from the geometric center 302 of the package core 200.

Figure 3C:
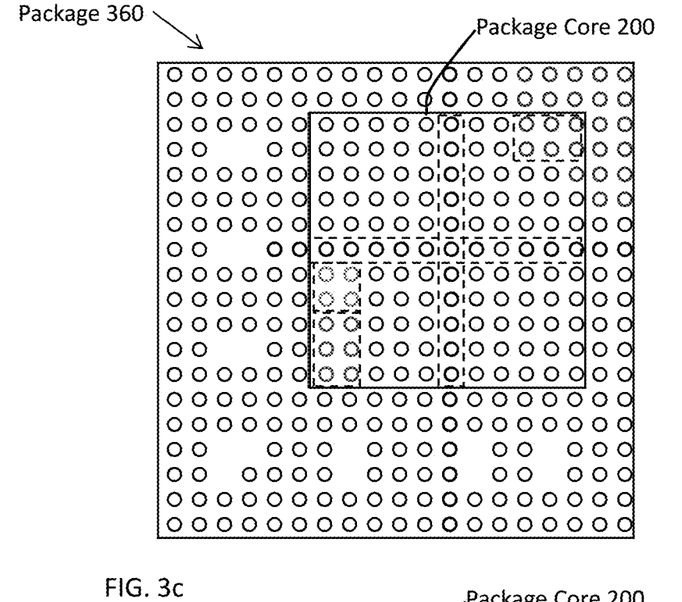
FIG. 3c illustrates another exemplary package having a second set of pads that are added in the multiple directions of the package.
Figure 3D:
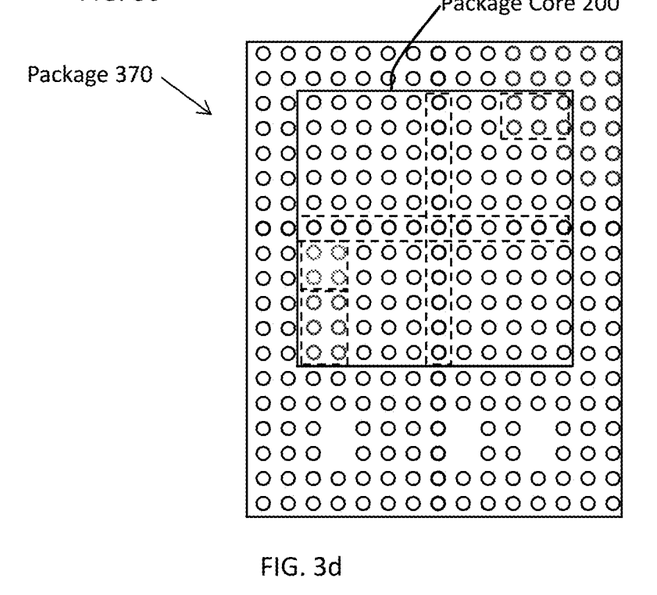
FIG. 3d illustrates another exemplary package having a second set of pads that are added in the multiple directions of the package.

FIGS. 3c and 3d illustrate additional exemplary packages for a product family. FIG. 3c includes concepts similar to those of FIG. 3b discussed above, but illustrates a package where the additional pads are distributed more to the second (e.g., bottom) and fourth (e.g., left) direction, in FIG. 3d the additional pads are distributed more to the second direction. For example, package 360 in FIG. 3c includes additional pads in the second and fourth directions to better accommodate one or more circuits and/or features related to digital ports and interfaces, with a smaller emphasis on analog pads (e.g., in the first and third direction of the package 360). Package 370 of FIG. 3d, includes additional pads in the second direction to accommodate one or more circuits and/or features related to high speed interfaces (e.g., such as CAN). In both packages 360 and 370, the first set of pads (i.e., in the respective package core 200) has a ballout and dimensions that is compatible with a chip core 100 of the same product family. The second set of pads is configured to accommodate one or more circuits outside the chip core 100 of the product family, respectively. For example, the second set of pads accommodates the one or more circuits outside the chip core 100 by providing signal input and/or output capability and/or power.

Also, the second set of pads in packages 360 and 370 are located asymmetrically with their respective first set of pads while the ballout of the package core 200 is maintained. In each package, the resulting geometric center of the package is different from the geometric center of its respective package core 200.

By way of example, FIGS. 3a to 3d demonstrate that additional pads can be added in any one or more directions to accommodate the additional features and/or circuits of the corresponding chip in the product family. The additional features and/or circuits are beyond those provided by the chip core 100. By placing the additional pads asymmetrically with respect to the center of the package core, the package size is better optimized. Further, the compatibility of the ballout for the chip core 100 is maintained for the product family. Put differently, any package configured for the product family is able to accept the chip core.

Thus, based on the concepts discussed herein different packages may be created for different members of a product family. In one embodiment, the method includes creating a package core comprising a first set of pads having a pinout that is compatible with a chip core of a product family. A second set of pads is created, located on substantially the same plane as the first set of pads and outside the package core. The second set of pads accommodates a circuit outside the chip core. The second set of pads is placed such that a geometric center of the package core is different from a geometric center of the IC package. For example, the second set of pads is only placed in the one or more directions (e.g., regions) of the circuit outside the chip core.

As discussed above, a pad may be a solder ball and a set of pads may comprise a ball grid array (BGA) of pads. In this regard, the package conducts electrical signals between the IC and the printed circuit board (PCB) on which it is placed. The ballout for pads that correspond to the chip core 100 is the same in the family of products. Accordingly, a package encapsulating only the chip core 100 is compatible with any PCB for any member of the product family with respect to the ballout of the chip core 100. Further, any package encapsulating any member of the product family is functionally compatible with any PCB for any member of the product family with respect to the ballout of the chip core 100. Perhaps these concepts are better explained with the following example.

Consider a first PCB configured to accept the largest package in the product family. Thus, it is configured to receive the ballout for the chip core 100 and additional pads for additional functionality and/or circuits of the chip in the product family. This first PCB can also functionally accept a package that only encapsulates the chip core 100. Of course, the additional features and functions for the additional pads (i.e., for the circuits outside the chip core 100) will be lost.

Consider now a second PCB configured to functionally receive the ballout for only the chip core 100. For example, the PCB may not have any additional pins to accommodate any solder balls beyond those of the ballout for the chip core 100. The second PCB can still accept the largest package in the product family, but will only be able to transmit the signals associated with the ballout of the chip core 100.

It should be noted that in some BGA packages, the solder balls closer to the center are typically more reliable than bumps in the exposed corner region of the package. Also, for solder balls, the difference in coefficient of thermal expansion between the PCB substrate and the BGA package (i.e., thermal stress) or flexing and vibration (i.e., mechanical stress) may cause the solder joints to fracture more readily in specific areas of the package.

The signal fan-out on the PCB typically uses fully populated rows in the outer rows of the package. In the inner area of the BGA ball-out, (e.g., when there are many rows of solder balls, additional area may be needed without solder balls. The purpose for this ball-free area may be to provide a through via at a location where a solder ball is typically placed. In one example, to adapt the package pin-out for two different package sizes, the pad re-location can be implemented with redundant pads.

In one embodiment, the second set of pads may be used for redundancy of signals of interest. For example, one or more signals from the chip core 100 are routed to the package core and to respective solder balls in the second set of pads. Alternatively, the one or more signals from the chip core 100 may be routed to respective solder balls in the second set of pads instead of the package core. Accordingly, a signal may be routed to the package core and the periphery or just the periphery (e.g., instead of the package core).

As discussed above, there are structures (e.g., PCB's) that are configured to receive the pinout (e.g., ballout) of chip packages. Electrical signals can then be conducted from the IC housed by the chip package to the PCB (on which the chip package is placed). The structural interface between the chip package and the PCB may be a socket. Such a socket may be an inherent part of a PCB or a separate part altogether.

While sockets are used for many package types mentioned herein, it will be understood that sockets are generally not used for BGA's in the volume production phase. Instead, the solder balls are typically heated directly onto the pads of the PCB's. However, during development it may not be practical to solder BGAs into place, and sockets may be used instead. Further, during the device production process, the package may be temporarily electrically connected to the PCB to test the functionality of the device. In this regard, a socket is a mechanical component that provides mechanical and electrical connections between a package housing a chip and a PCB, allowing the package to be connected to the PCB without soldering.

Figure 4:
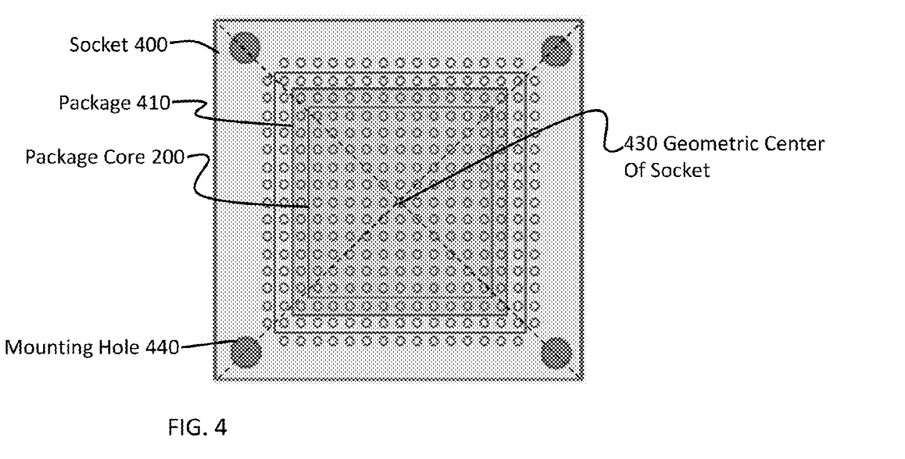
FIG. 4 illustrates an exemplary socket with a chip package in its symmetric center.

FIG. 4 illustrates an exemplary socket 400 that has received a chip package 410. The chip package 410 has a package core 200 that is common for different packages in the family of products. Package 410 includes additional pads (i.e., pads outside the package core 200) that may be used to accommodate additional functions and features of the IC chip it houses. In the example of FIG. 4, the package 410 is placed in the center of the socket 400. Put differently, the geometric center of the socket 400 is the same as the geometric center of the chip package 410. Mounting holes 440 may be used to align the chip package 410 onto the socket 400 during placement. Mounting holes 440 may also be used to secure the chip package 410 on the socket.

Figure 5A:
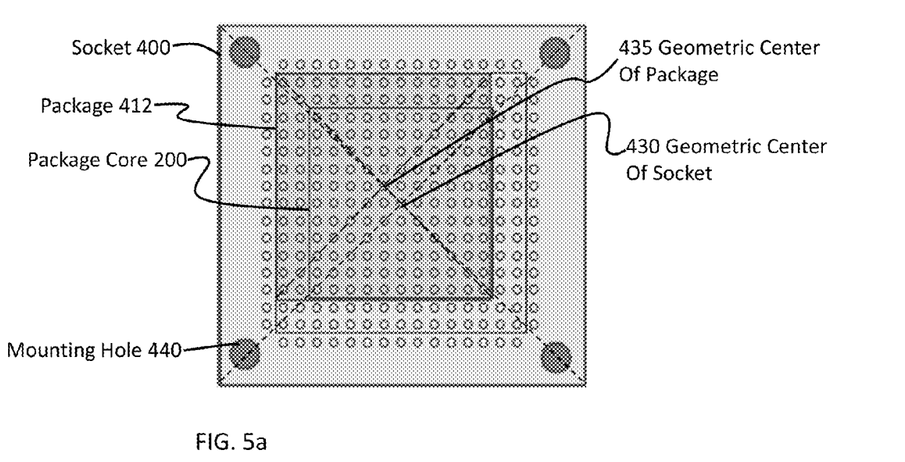
FIG. 5a illustrates an exemplary socket with a chip package, wherein the geometric center of the package is different from the geometric center of the package.

As discussed herein, some packages have a geometric center that is different from the geometric center of the IC package, while the package core is compatible with the family of products. In this regard, FIG. 5a illustrates an exemplary socket 400 that has thereon a chip package 412 that is "off-center." Put differently, the geometric center of the socket 430 is different from the geometric center of the package 435. However, the package core 200 is centered in the socket 400. Thus, in one embodiment, the package core 200 has a geometric center that is common with the socket 430, while at the same time the geometric center of the package 412 is different from that of the socket 430.

Figure 5B:
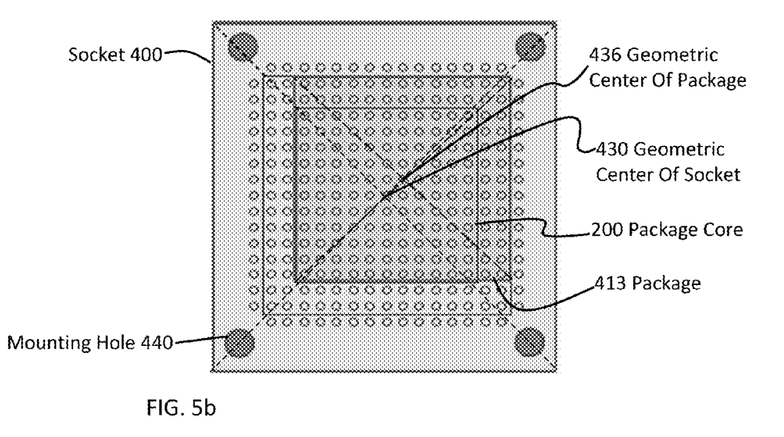
FIG. 5b illustrates another exemplary socket with a chip package, wherein the geometric center of the package is different from the geometric center of the package.

Reference now is made to FIG. 5b, which illustrates another exemplary socket 400 that has thereon a different chip package 413 that is "off-center." Again, the geometric center of the socket 430 is different from the geometric center of the package 436. As in the example of FIG. 5a, the package core 200 in FIG. 5b is centered with respect to the socket 400. Thus, the same socket 400 is configured to receive different packages for a product family. Such compatibility for different packages for a product family saves substantial hardware cost and eliminates the design complexity of developing a different socket for each package of a product family.

Figure 5C:
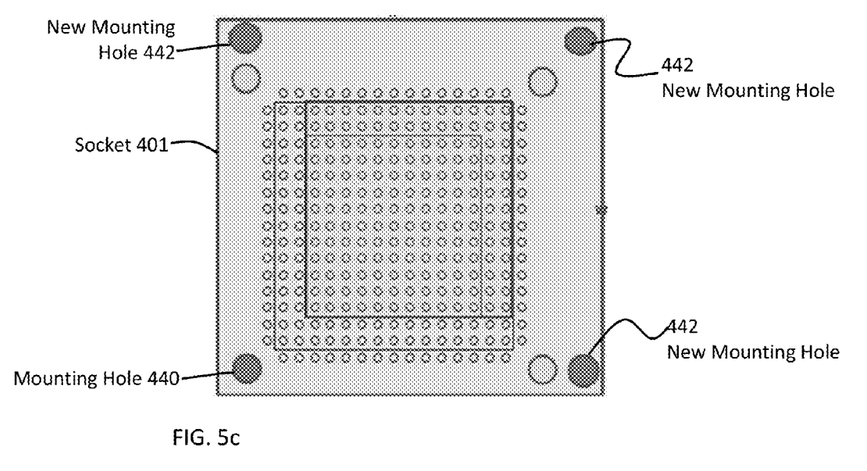
FIG. 5c illustrates an exemplary socket with new mounting holes.

In various embodiments, mounting holes may be provided having an offset from the original mounting holes of the socket to enable the connection of different packages with the same socket. In this regard, FIG. 5c illustrates an exemplary socket 401 with new mounting holes 442. For example, mounting holes 442 may be used to provide an offset from the contact area of the package 410 of example FIG. 5b. For example, the socket may be rotated by 90, 180 or 270 degrees, thereby allowing the contact area of the socket to be coupled with different pads of the PCB below. Accordingly, the chip package can be configured with different (e.g., 4) parameter sets related to the socket position. The offset of the package from the center of the package may be changed in the top, bottom, and/or diagonal direction. This can be done by the change of the socket footprint as explained above, or by a different placement of the package on the board in combination with a permanent interconnect (e.g., a solder joint).

As discussed above in connection with FIGS. 5a to 5d, the IC package system may accommodate several packages of a product family. For example, a first and second package of a product family may each include a package core comprising a first set of pads having a pinout that is compatible with a chip core of a product family. Both the first and second packages of the product family may each include a second set of pads located on substantially the same plane as the first set of pads of the respective package and outside the respective package core. The additional sets of pads of the first and second package are each configured to accommodate a circuit located outside the chip core, respectively. The IC package system includes a socket configured to accept the first and second packages of the product family. Alternatively, the first and second packages may be coupled directly onto the PCB. In this exemplary system, the geometric center of the first package core is the same as the geometric center of the socket. Similarly, the geometric center of the second package core is the same as the geometric center of the socket. The geometric centers of the first and second packages may be different from the geometric center of the socket. Further, the geometric centers of the first and second packages, respectively, may be different from the geometric center of the socket. Also, the geometric center of the first package may be different form the geometric center of the second package. The first package may have dimensions that are the same or be different from the second package.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings. Accordingly, the disclosure is intended to cover alternatives, modifications and equivalents, which may be included within the scope of the disclosure. For example, other known packages can be used instead of a BGA.

While the foregoing has been described in conjunction with exemplary embodiments, it is understood that the term "exemplary" is merely meant as an example, rather than the best or optimal.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. An Integrated Circuit (IC) package, comprising:
   a substrate;
   a package core comprising a first set of pads formed on the substrate, the first set of pads having a pinout that is compatible with a chip core of a product family; and
   a second set of pads formed on the substrate and located on substantially the same plane as the first set of pads formed on the substrate and outside the package core, the second set of pads being configured to accommodate a circuit located outside the chip core, wherein a geometric center of the package core is different from a geometric center of the substrate.

2. The IC package of claim 1, wherein at least one of the first and second sets of pads comprises solder balls.

3. The IC package of claim 1, wherein the second set of pads is located asymmetrically with respect to the package core.

4. The IC package of claim 1, wherein the second set of pads is configured to accommodate the circuit outside the chip core by conducting electrical signals between the circuit outside the chip core and the substrate.

5. The IC package of claim 4, wherein the substrate is a printed circuit board (PCB), and wherein a pinout for the package core is compatible with the PCB and any other PCB configured for any member of the product family.

6. The IC package of claim 1, wherein the second set of pads is configured to accommodate the circuit outside the chip core by providing at least one of: (i) input capability, (ii) output capability, and (iii) power to the circuit outside the chip core.

7. The IC package of claim 1, wherein a pinout for the first set of pads is the same for all packages of the product family.

8. The IC package of claim 1, wherein the second set of pads is located adjacent to the chip core only along one or more directions with respect to the chip core in which the circuit is located outside the chip core.

9. The IC package of claim 1, wherein at least one signal path from the chip core is routed to both a pad in the first set of pads and a pad in the second set of pads.

10. A method of configuring an Integrated (IC) package, comprising:
    creating a package core comprising a first set of pads formed on a substrate and having a pinout that is compatible with a chip core of a product family; and
    forming a second set of pads on the substrate, the second set of pads being located on substantially the same plane as the first set of pads and outside the package core, wherein the second set of pads accommodates a circuit outside the chip core, and wherein the first set of pads and the second set of pads are formed such that a geometric center of the package core is different from a geometric center of the substrate.

11. The method of claim 10, wherein the forming the second set of pads comprises placing the second set of pads asymmetrically with respect to the package core.

12. The method of claim 10, wherein accommodating the circuit outside the chip core comprises conducting electrical signals between the circuit outside the chip core and the substrate.

13. The method of claim 12, wherein the substrate is a printed circuit board (PCB), and wherein the method further comprises configuring a pinout for the package core to be compatible with the PCB and any other PCB configured for any member of the product family.

14. The method of claim 10, wherein the second set of pads is configured to accommodate the circuit outside the chip core by providing at least one of: (i) input capability, (ii) output capability, and (iii) power to the circuit outside the chip core.

15. The method of claim 10, further comprising configuring a pinout for the first set of pads to be the same for all packages of the product family.

16. The method of claim 10, further comprising placing the second set of pads only along one or more directions with respect to the chip core in which the circuit is located outside the chip core.

17. The method of claim 10, further comprising routing at least one signal path from the chip core to both a pad in the first set of pads and a pad in the second set of pads.

18. The method of claim 10, further comprising placing the IC package onto a socket configured to accept different packages of the product family and placing the socket onto the substrate, such that (i) the geometric center of the IC package is different from a geometric center of the socket, and (ii) the geometric center of the package core is the same as the geometric center of the socket.

19. An Integrated Circuit (IC) package system, comprising:

a circuit board;

a package core comprising a first set of pads formed on the circuit board, the first set of pads having a pinout that is compatible with a chip core of a product family;

a second set of pads formed on the circuit board and located on substantially the same plane as the first set of pads formed on the circuit board and outside the package core, the second set of pads being configured to accommodate a circuit located outside the chip core; and a socket disposed on the circuit board and configured to accept different packages of the product family, wherein:

a geometric center of the package core is different from a geometric center of a combination of the first set of pads and the second set of pads; and the geometric center of the combination of the first set of pads and the second set of pads is different from a geometric center of the socket.

20. The system of claim 19, wherein the geometric center of the package core is the same as the geometric center of the socket.

21. The IC package of claim 1, wherein the substrate is a single printed circuit board.

\* \* \* \* \*